United States Patent

Yeshin

[15] 3,658,529

[45] Apr. 25, 1972

[54] PHOTOGRAPHIC PROCESS

[72] Inventor: Leon Yeshin, Toronto, Ontario, Canada

[73] Assignee: W. R. Grace & Co., New York, N.Y.

[22] Filed: Nov. 28, 1969

[21] Appl. No.: 880,904

[52] U.S. Cl. .......................................96/35.1, 96/115, 96/87
[51] Int. Cl. ..........................................G03c 5/00, G03c 1/68
[58] Field of Search ...............................96/35.1, 33, 87, 115

[56] References Cited

UNITED STATES PATENTS

| | | | |
|---|---|---|---|
| 3,395,014 | 7/1968 | Cohen et al. | 96/35.1 |
| 3,406,067 | 10/1968 | Cerwonka | 96/35.1 |
| 3,055,758 | 9/1962 | McDonald | 96/48 |
| 3,235,381 | 2/1966 | Field, Jr. et al. | 96/87 |

*Primary Examiner*—Norman G. Torchin
*Assistant Examiner*—Edward C. Kimlin
*Attorney*—Kenneth E. Prince

[57] ABSTRACT

Photographs are obtained from an element containing a photocurable composition. The element consists of a liquid photocurable composition absorbed (impregnated) into and onto a porous essentially transparent support layer. The process includes, for example, exposing the photocurable element to actinic or U.V. radiation through a line or halftone negative image, and separating the sheets. The unexposed photocurable composition is leached out of the porous support layer, thereby exposing the surface of the support layer. The support layer containing the photocured composition is, in effect, a photograph in that the support layer surface is visually distinguishable from the photocured composition. The liquid photocurable composition contains at least a polyene, a polythiol and a photocuring rate accelerator, and a coloring agent when the visual effects or differences must be enhanced to produce a photograph.

4 Claims, No Drawings

PHOTOGRAPHIC PROCESS

BACKGROUND OF THE INVENTION

1. Objectives of the Invention

It is an objective of this invention to provide process for reproducing images in a permanent medium. Other objectives will be obvious to those skilled in the art.

2. Prior Art

Photographs have been made by impregnating translucent foam material having interconnecting cells with a silver photographic emulsion, imagewise exposing the material, and developing and fixing the photographic emulsion, see U.S. Pat. No. 3,235,381.

BROAD DESCRIPTION OF AN INVENTION

This invention includes a photographic process for preparing image reproductions from photocurable elements. The process includes impregnating a photocurable composition on and in a layer which is essentially transparent to actinic radiation to produce a photocurable element. The photocurable element is exposed imagewise, through a continuing tone positive or negative transparing, a line positive or negative, a halftone negative or positive or a stencil, to actinic radiation. The exposed portions of the photocurable composition are converted to an insoluble, hardened state, which is colored. If a line or halftone image was used, all of the unexposed areas will contain uncured photocurable composition which has to be removed. If a continuous tone image was used, the cured composition will vary in depth in the exposed element so that varying amounts of photocurable composition (exposed in a sense) will have to be removed in the imaged areas (depending upon image density). The unexposed portion of the photocurable composition is removed to produce an element containing a visually distinguishable image. The exposure is preferably done using ultraviolet (U.V.) light. The resulting element can be used as a photograph, or if desired, as a slide, etc.

This invention also includes the photocurable element and the resultant photocured element.

DETAILED DESCRIPTION OF THE INVENTION

The term "colored," as used herein, means visually different from the essentially transparent layer. The term "-colored" includes white, black, grey, any color, etc. When the essentially transparent layer is tinted, shaded, etc., but still transmits antinic radiation, the term "colored" includes visually distinguishable tints, shades, etc.

When the difference between the imaged and nonimaged-removed areas of the film are visually difficult to detect, a dye or pigment can be incorporated into the photocurable composition to help produce a visually observable image. Useful inorganic pigments for a light absorptive layer include iron oxide in various forms, e.g., Indian red, Venetial red, ocher, umber, sienna, iron black and the like; lead chromate, lead molybdate (chrome yellow and molybdenum orange); cadmium yellow, cadmium red, chromium green, iron blue, manganese black, various carbon blacks such as lamp black, furnace black, channel black and the like. Organic dyes soluble in the vehicles normally used in applying the light absorptive layer are best added as pigments in the form of lakes prepared by precipitating an insoluble salt of the dye on an inert, inorganic substrate. A list of such lakes and similar organic pigments is shown in "Printing and Litho Inks," J. H. Wolfe, pages 124–173, Fourth Edition, MadNair-Dorland and Co., New York (1949). The preferred coloring additive is carbon black. The dye must be selected carefully so that it colors only the photocurable composition and does not color the essentially transparent layer.

The crucial ingredients in the photocurable compositions are:

1. about 2 to about 98 parts by weight of an ethlenically unsaturated polyene containing two or more reactive unsaturaged carbon-to-carbon bonds;
2. about 98 to about 2 parts by weight of a polythiol; and
3. about 0.0005 to about 50 parts by weight (based on 100 parts by weight of (1) and (2) of a photocuring rate accelerator).

The reactive carbon-to-carbon bonds of the polyene are preferably located terminally, near terminally, and/or pendant from the main chain. The polythiols preferably contain two or more thiol groups per molecule. These photocurable compositions are liquid at over the temperature range encountered.

Included in the term "liquid," as used herein, are those photocurable compositions which in the presence of inert solvent, aqueous dispersion or plasticizer have a viscosity ranging from essentially zero to 20 million centipoises at 70° C. The term liquids includes suspension, etc.

As used herein, polyenes and polyynes refer to simple or complex species of alkenes or alkynes having a multiplicity, i.e., at least 2, "reactive" carbon-to-carbon unsaturated functional groups per average molecule. For example, a diene is a polyene that has two "reactive" carbon-to-carbon double bonds per average molecule, while a diyne is a polyyne that contains in its structure two "reactive" carbon-to-carbon triple bonds per average molecule. Combinations of "reactive" double gonds and "reactive" triple bonds within the same molecule are also operable. An example of this is monovinylacetylene, which is a polyeneyne under our definition. For purposes of brevity all these classes of compounds will be referred to herein as polyenes.

As used herein the term "reactive" unsaturated carbon-to-carbon groups means groups which will react under proper conditions as set forth herein with thiol groups to yield the thioether linkage $$(-\overset{|}{\underset{|}{C}}-S-\overset{|}{\underset{|}{C}}-)$$

, as contrasted to the term "unreactive" carbon-to-carbon unsaturation which means $$-\overset{|}{C}=\overset{|}{C}-$$

groups found in aromatic nuclei (cyclic structures exemplified by benzene, pyridine, anthracene, and the like) that do not under the same conditions react with thiols to give thioether linkages. In the instant invention, products from the reaction of polyenes with polythiols which contain 2 or more thiol groups per average molecule are called polythioether polymers or polythioethers.

Methods of preparing various polyenes useful within the scope of this invention are disclosed in copending application having Ser. No. 674,773 filed Oct. 12, 1967, now abandoned and assigned to the same assignee. Some of the useful polyenes are prepared in the detailed examples, set forth in the following specification.

One group of polyenes operable in the instant invention is that taught in a copending application having Ser. No. 617,801; inventors: Kehr and Wszolek; filed Feb. 23, 1967; and assigned to the same assignee. This group includes those having a molecular weight in the range of 50 to 20,000, a viscosity ranging from 0 to 20 million centipoises at 70° C. of the general formula: $[A]-(X)_m$ wherein X is a member of the group consisting of $$R-\overset{R}{\overset{|}{C}}=\overset{R}{\overset{|}{C}}-$$

and $R-C\equiv C-$; $m$ is at least 2; R is independently selected from the group consisting of hydrogen, halogen, and an organic compound selected from the group consisting of aryl, substituted aryl, cyloalkyl, substituted alkyl groups containing one to 16 carbon atoms; and A is a polyvalent organic moiety free of (1) reactive carbon-to-carbon unsaturation and (2) unsaturated groups in conjunction with the reactive ene or yne groups in X. Thus A may contain cyclic groupings and minor amounts of hetero atoms such as N, S, P or O but contains primarily carbon-carbon, carbon-oxygen or silicon-oxygen containing chain linkages without any reactive carbon-to-carbon unsaturation. This group preferably has a molecular weight over 50.

In this first group, the polyenes are simple or complex species of alkenes or alkynes having a multiplicity of pendant, terminally or near terminally positioned "reactive" carbon-to-carbon unsaturated functional groups per average molecult. As used herein for determining the position of the reactive function carbon-to-carbon unsaturation, the term "terminal" means that said functional unsaturation is at an end of the main chain in the molecule; whereas by "near terminal" is meant that the functional unsaturation is not more than 16 carbon atoms away from an end of the main chain in the molecult. The term "pendant" means that the reactive carbon-to-carbon unsaturation is located terminally or near terminally in a branch of the main chain as contrasted to a position at or near the ends of the main chain. For purposes of brevity all of these positions will be referred to generally as "-terminal" unsaturation.

The liquid polyenes operable in this first group contain one or more of the following types of non-aromatic and non-conjugated "reactive" carbon-to-carbon unsaturation:

(1) —CH=CH—
(2) —C≡C—
(3) —C=CH₂
(4) —C≡CH
(5) —C=C— (with a single bond down from each C)
(6) —C=CH— (with a single bond down from the first C)
(7) =CH=C— (with a single bond down from C)
(8) —C=CH₂ (with a single bond down from C)

These functional groups as shown in 1–8 supra are situated in a position either which is pendant, terminal or near terminal with respect to the main chain but are free of terminal conjugation. As used herein the phrase "free of terminal conjugation" means that the terminal "reactive" unsaturated groupings may not be linked directly to non-reactive unsaturated species such as

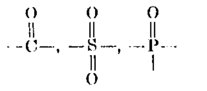

and the like so as to form a conjugated system of unsaturated bonds exemplified by the structure:

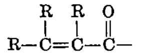

etc. On the average the polyenes must contain 2 or more "reactive" unsaturated carbon-to-carbon bonds per molecule and have a viscosity in the range from slightly above 0 to about 20 million centipoises at 70° C. Included in the term "-polyenes" as used herein are those materials which in the presence of an inert colvent, aqueous dispersion of plasticizer fall within the viscosity range set out above at 70° C. Operable polyenes in the instant invention have molecular weights in the range of about 50 to about 20,000, preferably about 500 to about 10,000.

Examples of operable polyenes from this first group include, but are not limited to:

1. Crotyl-terminated polyurethanes which contain two "reactive" double bonds per average molecule in a near terminal position of the average general formula:

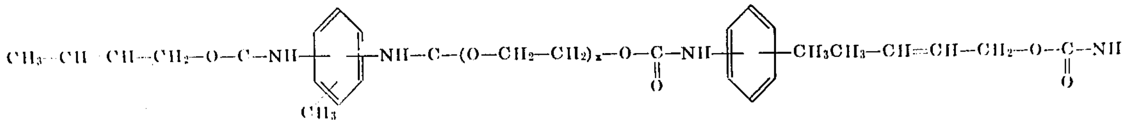

wherein $x$ is at least 1.

2. Ethylene/propylene/non-conjugated diene terpolymers, such as "Nordel 1040" manufactured by E. I. duPont de Nemours & Co., Inc., which contain pendant "reactive" double bonds of the formula: $—CH_2—CH{=}CH—CH_3$.

3. The following structure which contains terminal "reactive" double bonds:

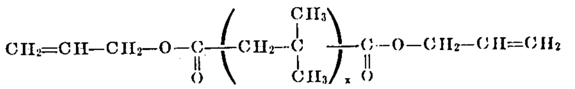

where $x$ is at least 1.

4. The following structure which contains near terminal "reactive" double bonds

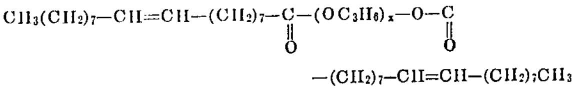

where $x$ is at least 1.

Another, or second, group of operable polyenes includes those unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber and the like; and unsaturated polyesters, polyamides, and polyurethanes derived from monomers containing "reactive" unsaturation, e.g., adipic acid-butenediol, 1,6-hexanediamine-fumaric acid and 2,4-tolylene diisocyanate-butenediol condensation polymers and the like.

A third group of polyenes operable in this invention includes those polymers in which the reactive unsaturated carbon-to-carbon bonds are conjugated with adjacent unsaturated groupings. Examples of operable conjugated reactive ene systems include but are not limited to the following:

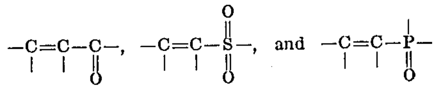

A few typical examples of polymeric polyenes which contain conjugated reactive double bond groupings such as those described above are poly(oxyethylene) glycol (600 M.W.) acrylate; poly(oxytetramethylene) glycol (1,000 M.W.) dimethacrylate, the triacrylate of the reaction product of trimethylol propane with 20 moles of ethylene oxide and the like.

As used herein, the term polythiols refers to simple or complex compounds having a multiplicity of pendant or terminally positioned —SH functional groups per average molecule.

On the average the polythiols must contain 2 or more —SH groups per molecule. They usually have a viscosity range of slightly above 0 to about 20 million centipoises (cps) at 70° C., as measured by a Brookfield Viscometer. Included in the term "polythiols" as used herein are those materials which in the presence of an inert solvent, aqueous dispersion or plasticizer fall within the viscosity range set out above at 70° C. Operable polythiols in the instant invention usually have molecular weights in the range about 50 to about 20,000, or more, preferably about 100 to about 10,000.

The polythiols operable in the instant invention can be exemplified by the general formula: $R_a—(SH)_n$ where $n$ is at least 2 and $R_n$ is a polyvalent organic moiety free from "reactive" carbon-to-carbon unsaturation. Thus $R_n$ may contain cyclic groupings and minor amounts of hetero atoms such as N, S, P or O but primarily contains carbon-hydrogen, carbon-oxygen, or silicon-oxygen containing chain linkages free of any "reactive" carbon-to-carbon unsaturation.

One class of polythiols operable with polyenes in the instant invention to obtain essentially odorless compositions are esters of thiol-containing acids of the general formula: HS—$R_b$—COOH where $R_b$ is an organic moiety containing no "reactive" carbon-to-carbon unsaturation, with polyhydroxy compounds of the general structure: $R_c$—$(OH)_n$ where $R_c$ is an organic moiety containing no "reactive" carbon-to-carbon unsaturation and $n$ is 2 or greater. These components will react under suitable conditions to give a polythiol having the general structure:

$$R_c\text{—}(O\underset{\underset{O}{\|}}{C}\text{—}R_b\text{—}SH)_n$$

where $R_b$ and $R_c$ are organic moieties containing no "reactive" carbon-to-carbon unsaturation and $n$ is 2 or more greater.

Certain polythiols such as the aliphatic monomeric polythiols (ethane dithiols, hexamethylene dithiol, decamethylene dithiol, tolylene-2,4-dithiol, etc.) and some polymeric polythiols such as thiol-terminated ethylcyclohexyl dimercaptan polymer, etc., and similar polythiols which are conveniently and ordinarily synthesized on a commercial basis, although having obnoxious odors, are operable in this invention. Examples of the polythiol compounds preferred for this invention because of their relatively low odor level and fast curing rate include but are not limited to esters of thioglycolic acid ($HS\text{—}CH_2COOH$), α-mercaptopropionic acid ($HS\text{—}CH(CH_3)\text{—}COOH$) and β-mercaptopropionic acid ($HS\text{—}CH_2CH_2COOH$) with polyhydroxy compounds such as glycols, triols, tetraols, pentaols, hexaols, etc. Specific examples of the preferred polythiols include but are not limited to ethylene glycol bis(thioglycolate), ethylene glycol bis(β-mercaptopropionate), trimethylolpropane tris(thioglycolate), trimethylolpropane tris(β-mercaptopropionate), pentaerythritol tetrakis (thioglycolate) and pentaerythritol tetrakis (β-mercroptopropionate), all of which are commercially available. A specific example of a preferred polymeric polythiol is poly(propylene ether) glycol bis(β-mercaptioropionate) prepared from poly (propylene ether) glycol (e.g., plurocol P2010, Wyandotte Chemical Corp.) and β-mercaptopropionic acid by esterification.

The preferred polythiol compounds are characterized by a low level of mercaptan-like odor initially, and after reaction give essentially odorless cured poly-thioether end products which are commercially useful resins or elastomers.

As used herein the term "odorless" means the substantial absence of the well-known offensive and sometimes obnoxious odors that are characteristic of hydrogen sulfide and the derivative family of compounds known as mercaptans.

The term "functionality" as used herein refers to the average number of ene or thiol groups per molecule as the polyene and/or the polythiol. For example, a triene is a polyene with an average of three "reactive" carbon-to-carbon unsaturated groups per molecule and thus has a functionality ($f$) of 3. A dithiol is a polythiol with an average of two thiol groups per molecule and thus has a functionality ($f$) of 2.

It is further understood and implied in the above definitions that in these systems the functionality of the polyene and the polythiol component is commonly expressed in whole numbers although in practice the actual functionality may be fractional. For example, a polyene component having a nominal functionality of 2 (from theoretical considerations alone) may in fact have an effective functionality of somewhat less than 2. Such a product is useful in the instant invention and is referred to herein as having a functionality of 2.

To obtain the maximum strength, resistance to low atmospheric pressures, heat resistance and freedom from tackiness, the reaction components consisting of the polyenes and polythiols of this invention generally are formulated in such a manner as to give solids, crosslinked, three dimensional network polythioether polymer systems on curing. In order to achieve such infinite network formation the individual polyenes and polythiols must each have a functionality of at least 2 and the sum of the functionalities of the polyene and polythiol components must always be greater than 4. Blends and mixtures of the polyenes and the polythiols containing said functionality are also operable herein.

The term porous, as used herein, includes tightly woven webs, porous solid sheets compressed fibrous sheets, etc.

As used herein, the term essentially transparent includes transparent and translucent (as opposed to opaque).

As used herein, the terms "impregnate" and "impregnate in and on," unless otherwise indicated, mean to cause to be filled, imbued, permeated or saturated (i.e., inter-penetrate) and/or to cause to be adhered thereto and therein as a layer.

Materials to serve as the porous, essentially transparent layers include a wide variety of porous synthetic polymeric sheets; fibrous sheets, such as essentially transparent, that is, glassing and papers used in the printing trades; essentially transparent fibre glass sheets; etc. Porous, essentially transparent films composed of high polymers, e.g., polystyrene, polyamides, polyolefins, polyesters, vinyl polymers and cellulosics are quite suitable. Specifically, the porous essentially transparent layer can be composed of various filmforming plastics such as addition polymers, vinylidene polymers, e.g., vinyl chloride, vinylidene chloride polymers with vinyl chloride, vinyl acetate, styrene, isobutylene and acrylonitrile; and vinylchloride copolymers with the latter polymerizable monomers; the linear condensation polymers such as the polyesters, e.g., polyethylene terephthalate; the polyamides, e.g., polyhexamethylene sebacamide; polyester emides, e.g., polyhexamethyleneadipamide/adipate, and the like. Fillers or other reinforcing agents can be present in the synthetic resin or polymer support such as various fibers (synthetic, modified, or natural), e.g., cellulosic fibers, for instance, cotton, cellulose acetate, viscose rayon, paper; glass wool; nylon and the like. These reinforced agents must be selected so that the layer (film) is still porous and essentially transparent.

More specific examples of the essentially transparent polymeric, porous layer are those composed of the following porous synthetic or natural organic polymeric sheets: cellulose ($Qw = 680$ at 39.5° C.); polystyrene ($Qw = 1{,}500$ at 35° C.); polyethylene (low density); poly (hexamethylene adipate-co-sebasebacate-co-aminocatroate); ethyl cellulose; and poly (4,4-isopropylidenediphenylene carbonate). The preferred porous organic polymers are cellulose and cellulose acetate.

The term $Qw$ found in the above paragraph is the transmission rate of water through certain porous polymers. The transmission rate Q has the following formula:

Q = (amount of permeant) (film thickness)/(area (time)
and Q is usually presented herein with the units:
(gm.) (ml.)/($m^2$) (24 hours)

The transmission rate does not consider pressure nor concentration of permeant. The transmission rate of water through a particular polymer usually must be above about 100 (in the above units) in order for the porous polymer to be useful within this invention. If the photocurable composition is in a non-aqueous liquid system before it is absorbed into the porous support layer the liquid(s) used to suspend or as a solvent for the photocurable components (polyene, etc.) must have a transmission rate of above about 100 for the particular porous support layer. See, for example, the transmission rates of various organic compounds through low density polyethylene listed in Table 3 on page V-23 of Brandrup et al., *Polymer Handbook*, Interscience Publishers, New York (1966), said table being incorporated herein by reference. The transmission rate of any non-aqueous liquid(s) used to leach out the unexposed photocurable composition after imagewise exposure of the photocurable element must be above about 100. In view of the above, it is seen that if non-aqueous liquid systems are used exclusively, the $Qw$ of the support layer need not always be above about 100.

A short discussion of the various factors effecting transmission of fluids through a porous polymeric sheet is presented below.

Density can be regarded as a measure of the "looseness" of the polymer structure, and, in general, the lower the density the higher the porosity. Molecular weight of a polymer has little effect of sorption into the molecular pores, except in the very low-range of molecular weights. The presence of plasticizers in the polymer usually increases the permeability. Orientation of polymer molecules reduces the permeability, and the higher the degree of crystallinity of a polymer, the lower the permeability. Permeability is reduced by crosslinking, especially for large molecular size permeants. While fillers generally decrease the permeability, the effect is complicated by the type, shape and amount of filler and the filler's interaction with the permeant. It should be stated that the method of vulcanization has a significant effect on the permeability of elastomers. A porous sublayer can be placed on any suitable support layer (porous or nonporous) and then the photocurable composition can be absorbed into the porous layer.

The useful, essentially translucent or transparent, fibrous wood papers are made from mechanical pulp (groundwood), chemical pulp and semi-chemical pulp (and reclaimed wood pulps). Mechanical pulp comes in several grades and produces a paper which is very absorbent. The two principal types of chemical pulp are sulfite pulp and sulfate pulp (bleached, semibleached and unbleached). The unbleached sulfite pulp comes in several grades and produces a paper which is very absorbent. The unbleached sulfite pulp produces a paper which is very strong. Bleached sulfite pulp produces a paper which is very strong and is very absorbent. At least one grade of bleached sulfate pulp paper is absorbent (but soft). Any of the coniferous or decidious woods can be used as a pulp source. The paper can contain fillers that are compatible with the photocurable composition and do not reduce the papers absorption ability for the photocurable composition below a tolerable level. Papers often contain up to 40 percent by weight fillers. Typical fillers are kaolin, titanium dioxide (e.g., anatase and rutile), calcium carbonate, zinc sulfide, lithopone, etc. In certain cases the photocurable composition with absorb onto the filler, along with the wood fibers. Other materials such as starches, natural gums, e.g., guar and locust bean, modified celluloses, e.g., carboxymethyl and hydroyethyl derivatives, polymers of the urea-formaldehyde and melamine-formaldehyde types, etc., can be added to increase the fiber-to-fiber bonding and wet strength of the paper. The degree of penetration of liquids into the paper is controlled to a great degree by the degree of sizing of the paper. Sizing is the process of adding materials to the paper in order to reduce the absorbence ability of the paper. Unsized paper freely absorbs liquids. Typical sizing agents and rosin, synthetic resins, cellulose derivatives, asphalt emulsions, various hydrocarbons and natural waxes, starches, glues, casein, "Aquapel," etc. The sizing agent "Aquapel" is the trade name for an alkyl ketene dimer which is commercially available from Hercules Powder Co.

Fibrous papers (essentially translucent or transparent) can be made from other natural fiber sources, such as, hemp, cotton, jute, cereal straw, esparto, bagasse, etc. Fibrous papers (essentially transparent) can be made from inorganic fibers, such as, asbestos, glass, etc. Also, woven and non-woven fibrous papers (essentially translucent or transparent) can be made from certain synthetic organic polymers, such as, nylon, polyolefins, etc. In the case of these latter fibrous papers, synthetic organic polymers can be utilized which are not porous enough to use in sheet-form.

Example of essentially translucent or transparent cloth layers include tightly woven cotton sheets, wool sheets, and the synthetic organic polymer (fiber) sheets.

The photocurable elements should be exposed to actinic radiation containing a substantial amount of ultra-violet radiation until substantial photocuring takes place in the exposed areas.

The photocuring reaction can be initiated by U.V. radiation contained in actinic radiation from sunlight or obtained from special light sources which emit significant amounts of U.V. light. (Useful U.V. radiation generally has a wave length in the range of about 2,000 to about 4,000 angstrom units.) Thus it is possible merely to actinic radiation under ambient conditions or otherwise and obtain a cured solid elastomeric or resinous product useful as a photographic recording material. But this approach to the problem results in extremely long exposure times which cause the process in the vast bulk of applications to be commercially unfeasible. Chemical photocuring rate accelerators (photoinitiators or -sensitizers or -activators) serve to drastically reduce the exposure time and thereby when used in conjugation with various forms of energetic radiation (containing U.V. radiation) yield very rapid, commercially practical photocures by the practice of the instant invention. Useful photocuring rate accelerators include benzophenone, acetophenone, acenaphthene-quinone, methyl ethyl ketone, thioxanthen-9-one, 7-H-Benz (de) antracene-7-one, dibenzosuberone, 1-napthaldehyde, 4,4'-bis (dimethylamino) benzophenone, fluorene-9-one, 1' -acetonaphthone, 2'-acetonaphthone, 2,3-butanedione, antra-quinone, 1-indanone, 2-tert-butyl anthroquinone, valerophenone, hexanophenone, 8-phenylbutyrophenone, p-morpholinopropiophenone, 4-morpholinobenzophenone, 4'-morpholinodesoxybenxoin, p-diacetylbenzene, 4-aminobenzophenone, 4'-methoxyacetophenone, benzaldehyde, a-tetralone, 9-acetylphenanthrene, 3-acetylindole, 1,2,5-triacetylbenzene; etc., and blends thereof. The photoinitiators are added in an amount ranging from about 0.0,005 to about 50 percent by weight of the polyene and polythio components in the instant invention. Benzophenone is the preferred photocuring rate accelerator.

It is important to select the correct exposure time in the photocuring process of this invention. That is, in making photographs, it is essential that the exposure be sufficient to harden the photocurable composition in the exposed image areas without causing significant curing the non-image areas. Aside from exposure time and light intensity, the extent of the exposure is dependent on the thickness of the impregnated photocurable layer, the curing temperature, the structure and functionality of the polyene and polythiol employed, the photoinitiator type and concentration, the photocuring rate, the presence of light absorbing pigments or dyes in the photocurable composition, and the character of the image to be produced. In general, the thicker the layer to be photocured, the longer the exposure time.

The compositions to be photocured, in accord with the present invention, may, if desired, include such additives as antioxidants, inhibitors, activators, fillers, antistatic agents, flame-retardant agents, thickeners, thixotropic agents, surface-active agents, viscosity modifiers, plasticizers, and the like within the scope of this invention. Such additives are preblended with the polyene or polythiol prior to impregnating it in and on the web. The aforesaid additives may be present in quantities up to 500 parts or more per 100 parts photocurable composition by weight and preferable 0.0,005 to 300 parts on the same basis. The type and concentration of the additives must be selected with great care so that the final composition remains photocurable under conditions of exposure encountered.

The compounding of the components prior to photocuring can be carried out in any convention manner which takes into account that the material is sensitive to U.F. radiation. This composition generally can be stored in the dark for extended periods of time prior to actual use or even incorporated in the ultimate structure.

The uncured (unexposed) photocurable composition can be removed by leaching with a suitable solvent. The solvent used for leaching the element is primarily a diluent which reduces the viscosity of the uncured mixture so that it is easily removed washed out by the leaching fluid. The washing (leaching) liquid is selected so that it is readily miscible with or emulsified with the uncured material, yet has little action on the photocured image or support layer. The preferred solvent liquids are water or water and a detergent and/or soap.

Mixtures of methanol and/or ethanol, with methyl, ethyl or propyl acetate are also operable for a large number of photocurable compositions. Other solvents with high evaporation rates are well-known to those skilled in the art. It should be noted herein that the term "solvent" includes not only organic solvents but also water and other aqueous systems wherein the unexposed photocurable material is soluble (including dispersible) in said systems and the photocured portion is not so affected. The use of aqueous systems as a solvent in the instant invention is advantageous not only economically, but also because of the elimination of the hazards involved in handling organic solvents. In those instances where the photocurable material is acidic or basic the unexposed portions can be washed (leached) by dissolving and/or dispersing the unexposed portions in an aqueous system of the opposite polarity, i.e., to use an aqueous acidic solvent system with a basic photocurable layer and vice versa. A specific example of such a system would be the use of an aqueous alkaline developer such as dilute aqueous sodium carbonate or sodium hydroxide solution with the photocurable layer containing acidic thiol or carboxyl groups. Obviously, the degree of acidity or alkalinity should not be allowed to reach those levels wherein the essentially completely photocured areas are attacked. The elements can be washed by applying the solvent with a sponge, brush or blotter; or in addition by means of jets or sprays; or by ultrasonic generators.

The uncured photocurable compositions also may be removed by heating the web and applying pressure or vacuum.

The web could be impregnated with a liquid photocurable composition containing a dye which can be neutralized or bleached by a chemical solution able to migrate through the liquid photocurable composition (uncured) but not the solid photocurable composition. After exposure of the impregnated web, the image is developed by bleaching out the dye from the uncured areas. The image is then fixed by re-exposing the web to ultra-violet light to cure this uncured photocurable composition.

The photocured areas could be colored in situ by incorporation of dye-stuffs which are activated by exposure to U.V. light or by the photocuring reaction of the photocurable composition.

The following examples will aid in explaining, but should not be deemed as limiting, the instant invention. In all cases, unless otherwise noted, all parts and percentages are by weight.

EXAMPLE 1

3,456.3 gm. (1.75 mole) of poly(propyleneether) glycol, commercially available under the trade name "PPG 2025" from Union Carbide, and 1.7 gm. of di-n-butyl tin dilaurate were paced in a 5-liter, round-bottom 3-necked flask. The mixture in the flask was degassed at 110° C. for one hour and was then cooled to 25° C. by means of an external water bath. 207 gm. (3.50 moles) of allyl alcohol, with stirring, were added to the flask. 609.0 gm. (3.50 moles) of an 80–20 percent isomer mixture of totylene-2,4-diisocyanate and tolylene-2,6-diisocyanate, respectively, sold under the trade name "-Mondur TD 80," was charged to the flask. The mixture was stirred well. The flask was cooled by the water bath during this period. Eight minutes after the "Mondur TD 80" was added, the temperature of the mixture was 59° C. After 20 minutes, it was 9.87 mg. NCO/gm; and after 75 minutes, it was 6.72 mg. NCO/gm. The water bath was removed 80 minutes after the "-Mundur TD 80" was added, the NCO content was 3.58 mg. NCO/gm.; after 135 minutes, it was 1.13 mg. NCO/gm.; and after 195 minutes, it was 0.42 mg. NCO/gm. At that point in time, the resultant polymer composition was heated to 70° C., and vacuum-stripped for one hour. The resultant polymer composition was labeled composition 1, and had a viscosity of 16,000 cps. as measured on a Brookfield Viscometer at 30° C. (Unless otherwise stated, all the viscosity measurements in the examples were made on a Brookfield Viscometer at 30° C.)

The above procedure was repeated five times, and resultant compositions were labeled compositions 2, 3, 4, 5, and 6 respectively. The heating step lasted 180 minutes, respectively. With composition 2, the temperature was 60° C. after 8 minutes; with composition 3, the temperature was 57° C. after 6 minutes; with composition 4, the temperature was 41° C. after 20 minutes, at which time the temperature was raised and held at 60° C.; with composition 5, the temperature was 57.4° C. in 8 minutes, was 42° C. in 40 minutes, then taken up to 60° C. and lowered to 58° C. after 120 minutes; and with composition 6, the temperature was 57° C. in 6 minutes, and was 41° C. after 60 minutes, at which time the temperature was immediately raised to 60° C. The viscosity of teh resultant polymer compositions was 15,500 cps; 16,000 cps.; 17,000 cps.; 16,800 cps.; and 16,200 cps., respectively.

Compositions 1, 2, 3, 4, 5, and 6 were placed in a 6-gallon container and stirred well. The resultant polymer composition had a viscosity of 16,600 cps. and the NCO content was 0.01 mg. NCO/gm. This composite polymer composition was labeled polymer A.

EXAMPLE 2

100 parts of polymer A, 10 parts of polythiol A, and 0.5 parts of benzophenone and 0.3 parts of fine-grade carbon black were thoroughly admixed. This resulted in photocurable composition A. Polythiol A was pentaerythritol tetrakis ($\beta$-mercaptopropionate), which is commercially available under the trade name "Q-43 Ester" (sold by Carlisle Chemical Co.). Photocurable composition A was dissolved in an equal weight of methyl ethyl ketone and used to impregnate a fine porosity paper (sold by W. & R. Balston Limited under the trade designation Whatman 50). Excess photocurable composition solution was removed from the surface of the paper. The solvent was removed by hanging the paper in a forced draught oven at 35° C. Kodak continuous density wedges S-9125 and F-0056 were placed against the impregnated paper and exposed to a 275 watt Westinghouse U.V. lamp held 12 inches away for 90 seconds. The paper was immersed in a bath of acetone and methanol (1:1) for 20 seconds to wash away unreacted polymer. The exposed paper was air-dried. The negative density wedges were found to have been produced clearly as positive images in the paper.

EXAMPLE 3

Example 2 was repeated, except that a half-tone (85 lines per inch) negative was used in place of the negative density wedges. A positive half-tone image was obtained.

EXAMPLE 4

Example 3 was repeated, except that the paper base was replaced with Plastamic R film (oil and filler extracted). Plastamic R is the trade designation for filled, plasticized polyolefin and is commercially available from W. R. Grace & Co. A positive half-tone image was obtained.

EXAMPLE 5

Example 2 was repeated, except that a half-tone positive was used. A negative half-tone image was obtained.

EXAMPLE 6

Example 4 was repeated, except that a line image negative was used. A line image was obtained.

EXAMPLE 7

Example 3 was repeated, except that 15 parts of polythiol A positive half-tone image was obtained.

EXAMPLE 8

Example 3 was repeated except that 60 parts of polymer B was used in place of polymer A. Polymer B was prepared as follows: 458 gms. (0.23 mole) of a commercially available liquid polymeric diisocyanate sold under the trade name "Adiprene L-100" by E. I. duPont de Nemours & Co. was charged to a dry resin kettle maintained under a nitrogen atmosphere and equipped with a condenser, stirrer, thermometer, and gas inlet and outlet. 37.8 gms. (0.65 mole) of allyl alcohol was charged to the kettle and the reaction was continued by 17 hours with stirring at 100° C. Thereafter, the nitrogen atmosphere was removed and the kettle was evacuated 8 hours at 100° C. 50 cc. dry benzene was added to the kettle and the reaction product was azeotroped with benzene to remove the unreacted alcohol. This allyl-terminated liquid polymer has a molecular weight of approximately 2,100 was labeled polymer B. A positive half-tone image was obtained.

EXAMPLES 9 TO 12

Example 3 was repeated four times, except that the pentaerythritol tetrakis ($\beta$-mercaptopropionate) was replaced with trimethylolpropane tris($\beta$-mercaptopropionate) (10 parts), (Example 2) trimethylolpropane tris (thioglycolate) (15 parts) (Example 10), pentaerythritol tetrakis (thioglycolate) (15 parts), (Example 11), polypropylene ether triol tris ($\beta$-mercaptopropionate) (50 parts), (Example 12), respectively. A positive half-tone image was obtained in each instance.

EXAMPLE 13

Example 3 was repeated, except that half of the pentaerythritol tetrakis ($\beta$-mercaptopropionate) was replaced with 5 parts of ethylene glycol bis($\beta$-mercaptopropionate). A positive half-tone image was obtained.

EXAMPLE 14

Example 2 was repeated, except that the Austin black was left out of the photocurable composition. A positive half-tone image (harder to see than when the Austin black was present) was obtained.

EXAMPLE 15

Example 3 was repeated, except that 100 parts of polymer C was used in place of polymer A. Polymer C was prepared as follows: 1,500 gms. (0.47 mole) of a linear solid polyester diol having a molecular weight of 3,200 and commercially available from Hooker Chemical Corp. under the trade name "Rucoflex S-1011-35" was charged to a 3-liter, 3-necked flask and heated to 110° C. under vacuum and nitrogen for 1 hour with stirring. 83 gms. of allyl isocyanate having a molecular weight of 83.1 and commercially available from Upjohn Co. was added to the flask along with 0.3 cc of dibutyl tin dilaurate (catalyst), commercially available from J. T. Baker & Co. The reaction was continued at 100° C. with stirring for 1 hour. This allyl-terminated polymer was labeled polymer C. A positive half-tone image was obtained.

EXAMPLES 16 TO 21

Example 3 was repeated six times, except that the benzophenone was replaced with cyclohexanone (0.5 part), (Example 16), acetone (1 part, (Example 17), methyl ethyl ketone (3.0 parts), (Example 18), dibenzosuberone (2parts), (Example 19), a blend of acetone (0.3 part) and p-diacetylbenzene (0.6 part), (Example 20) and 3-acetylphenanthrene (1 part), (Example 21), respectively. A positive half-tone image was obtained in each instance.

EXAMPLES 22 TO 27

Example 3 was repeated six times, except that the Whatman paper was replaced with a tightly woven nylon cloth, (Example 22), a woven cotton cloth fabrick, (Example 23), a fine wire copper screen, (Example 24), woven fiber glass fabric, (Example 25), and "DALKASEP," which is a microporous polyethylene film available from W. R. Grace & Co., (Example 27), respectively. A positive half-tone image was obtained in each instance.

EXAMPLE 28

10 gram of "Gentro 1002" (which is the trade name for a solid SBR rubber which is commercially available from General Tire and Rubber Co.), which was dissolved in 50 grams of mixed xylenes (as a solvent); 1 gram of pentaerythritol tetrakis ($\beta$-mercaptopropionate); 0.5 gram of benzophenone; and 0.1 gram of silica ("Hi-Sil 233"), added as a thickening agent, were admixed. "Hi-Sil 233" is the trade name for finely divided silica filler, having a particle size of 0.03 micron, and is commercially available from PPG Industries, Inc. Example 1 was repeated, except than an equal amount of the above photocurable composition was used in place of photocurable composition A. A positive half-tone image was obtained.

EXAMPLES 29 and 30

Example 2 was repeated twice, except that the Austin black was replaced with phthalocyanine green (0.25 grams), (Example 29), and phthalocyanine blue (0.2 grams), (Example 30), respectively. Positive half-tone images were obtained.

What is claimed is:

1. A photographic process for preparing image reproductions from photocurable elements which comprises:

1. impregnating a porous layer transparent to actinic radiation with a dye or pigment filled liquid photocurable composition having a viscosity in the range 0–20 million centipoises at 70° C. consisting essentially of (a) 2–98 parts by weight of a polyene containing at least two reactive unsaturated carbon to carbon bonds per molecule and (b) 98–2 parts by weight of a polythiol containing at least 2 thiol groups per molecule, the total combined functionality of the reactive unsaturated carbon to carbon bonds per molecule in the polyene and the thiol groups per molecule in the polythiol being greater than four and (c) 0.0,005–50 percent by weight of said polyene and said polythiol of a photocuring rate accelerator to produce a photocurable element,
2. exposing imagewise, through a continuous tone negative, a line negative, a half-tone negative, a continuous tone positive, a line positive, a half-tone positive, or a stencil, said layer containing said dye or pigment filled photocurable composition to actinic radiation, whereby the exposed portions of the photocurable composition are converted to an insoluble, hardened state, and
3. removing the unexposed portion of said photocurable composition, thereby producing an element containing a visually distinguishable image.

2. A process as described in claim 1, wherein said photocurable element is exposed to ultra-violet radiation.

3. A process as described in claim 1, wherein the photocuring is achieved at a temperature between about 20° C. and about 70° C.

4. A process as described in claim 1, wherein said layer is a solid, porous, essentially transparent synthetic polymer sheet.

* * * * *